(12) United States Patent
Krieg

(10) Patent No.: US 11,645,439 B2
(45) Date of Patent: May 9, 2023

(54) METHOD FOR VALIDATING A HARDWARE SYSTEM

(71) Applicant: TECHNISCHE UNIVERSITAET WIEN, Vienna (AT)

(72) Inventor: Christian Krieg, Vienna (AT)

(73) Assignee: TECHNISCHE UNIVERSITAET WIEN, Vienna (AT)

( * ) Notice: Subject to any disclaimer, the term of this patent is extended or adjusted under 35 U.S.C. 154(b) by 164 days.

(21) Appl. No.: 17/415,404

(22) PCT Filed: Dec. 11, 2019

(86) PCT No.: PCT/EP2019/084549
§ 371 (c)(1),
(2) Date: Jun. 17, 2021

(87) PCT Pub. No.: WO2020/126718
PCT Pub. Date: Jun. 25, 2020

(65) Prior Publication Data
US 2022/0067252 A1 Mar. 3, 2022

(30) Foreign Application Priority Data
Dec. 20, 2018 (EP) ..................................... 18214502

(51) Int. Cl.
*G06F 30/33* (2020.01)
*G06F 30/327* (2020.01)
(52) U.S. Cl.
CPC ............ *G06F 30/33* (2020.01); *G06F 30/327* (2020.01)
(58) Field of Classification Search
USPC ........................................................ 716/103
See application file for complete search history.

(56) References Cited

U.S. PATENT DOCUMENTS

| 7,512,571 B2 * | 3/2009 | Rudolf | G06V 10/7715 |
| | | | 706/14 |
| 2008/0270332 A1 * | 10/2008 | Rudolf | G06N 3/063 |
| | | | 706/14 |

(Continued)

OTHER PUBLICATIONS

International Preliminary Report on Patentability in corresponding International Application No. PCT/EP2019/084549 dated Jun. 16, 2021.

(Continued)

*Primary Examiner* — Mohammed Alam
(74) *Attorney, Agent, or Firm* — Hoffmann and Baron, LLP

(57) ABSTRACT

Disclosed is a method for validating a hardware system by a model thereof, which method comprises: providing reference structures and determining, in the model, sub-structures, each of which is structurally equivalent to one of the reference structures; extracting, from the model, input cones for each sub-structure; creating monopartite candidate graphs by mapping the bipartite sub-structure and the respective input cones to one of the candidate graphs; creating, for each candidate graph, a match vector, each dimension of the match vector comprising a count of occurrences, in the candidate graph, of a different one of predetermined graphlets; clustering, on the basis of similarity of the match vectors, the candidate graphs in clusters; and selecting, from each of the clusters, one candidate graph and determining a functional behaviour of the respective sub-structure of the selected candidate graph for validating the hardware system.

7 Claims, 3 Drawing Sheets

(56) References Cited

U.S. PATENT DOCUMENTS

| | | | |
|---|---|---|---|
| 2015/0100929 A1* | 4/2015 | Redekopp | G10L 19/265 |
| | | | 716/103 |
| 2017/0147722 A1* | 5/2017 | Greenwood | G06N 3/126 |
| 2021/0397610 A1* | 12/2021 | Singh | G06F 16/2425 |
| 2022/0067252 A1* | 3/2022 | Krieg | G06F 30/33 |

OTHER PUBLICATIONS

Demrozi, Florence, et al., "Exploiting Sub-Graph Isomorphism and Probabilistic Neural Networks for the Detection of Hardware Trojans at RTL," 2017 IEEE International High Level Design Validation and Test Workshop (HLDVT). IEEE, 2017.

Iccolboni, Luca, et al., "Efficient Control-Flow Subgraph Matching for Detecting Hardware Trojans in RTL Models," ACM Transactions on Embedded Computing Systems (TECS) vol. 16, No. 5s, pp. 1-19 ( Sep. 2017).

PCT International Search Report corresponding to International Application No. PCT/EP2019/084549 dated Feb. 27, 2020 https://doi.org/10.1145/3126552.

European Search Report corresponding to Application No. 18214502.9-1224 dated Jun. 28, 2019.

* cited by examiner

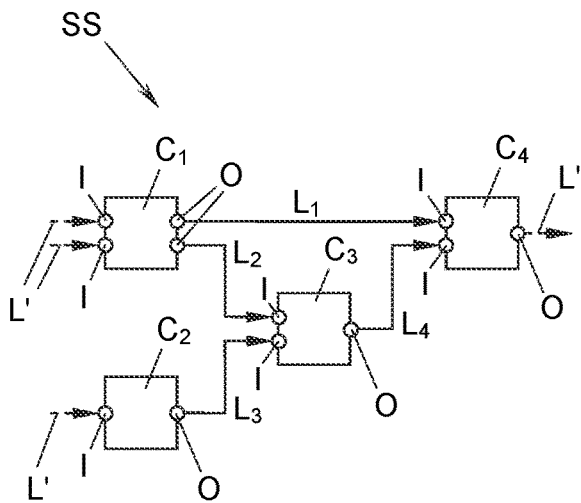
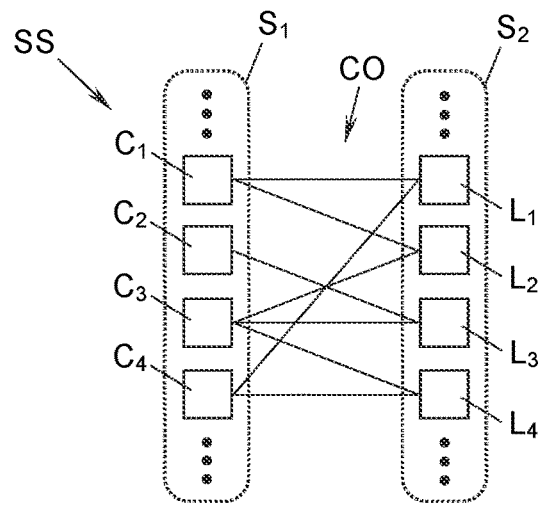
*Fig. 2a*  *Fig. 2b*
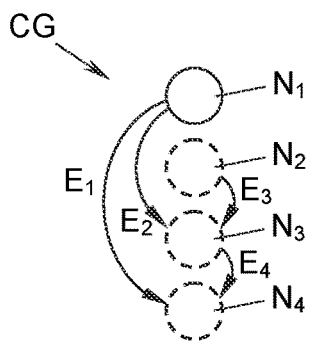
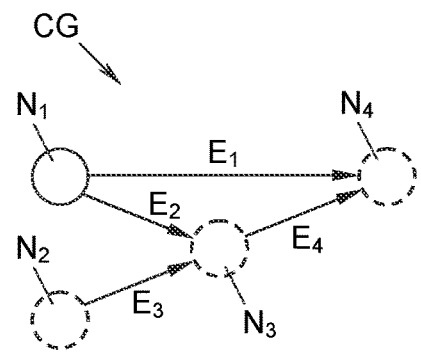
*Fig. 2c*  *Fig. 2d*
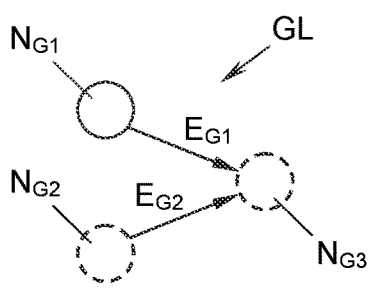
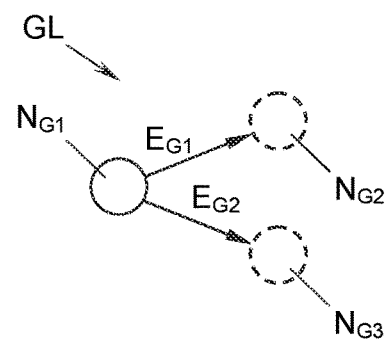
*Fig. 3a*  *Fig. 3b*

METHOD FOR VALIDATING A HARDWARE SYSTEM

CROSS-REFERENCE TO RELATED APPLICATIONS

This application is a National Phase application of International Application No. PCT/EP2019/084549 filed Dec. 11, 2019 which claims priority to European Patent Application No. 18 214 502.9 filed Dec. 20, 2018, the disclosures of which are incorporated herein by reference.

TECHNICAL FIELD

The present subject matter relates to a computer-implemented method for automatically validating a hardware system by a model thereof, the model being a netlist at register transfer level.

BACKGROUND

Nowadays, electrical and electronic circuits (herein: also "hardware systems") are increasingly designed and/or manufactured by third party suppliers according to respective functional specifications. While decreasing time to market, such distribution of efforts and responsibilities creates threats to the function of the hardware system. Hence, a demand for examination of the designed and/or manufactured hardware systems arises to reliably discover potential threats and to validate a hardware system when the hardware system performs according to the functional specification. This validation is also referred to as "verification" in the environment of hardware system development and testing. Said threats are, generally, non-specified functions which were inadvertently or deliberately added to the hardware system and impair the originally specified function thereof. One class of such threats are so-called "hardware Trojans" which perform malicious functions that are triggered by specific, usually rare, events and are, consequently, difficult to detect.

Hardware systems are commonly specified and described in hardware description language (HDL), such as VHDL or Verilog. While an automatic validation of thusly described hardware systems is per se possible, it is computationally expensive in particular due to the increasing size and complexity of today's hardware systems.

One established method to reduce the computational expenses of the examination and validation is to define one or more patterns (also: "structures") of functions of interest, e.g., malicious functions, and to search for the defined patterns in the hardware system and to focus the validation thereon. However, due to the diverse variants in describing one and the same (malicious) function, the definition of the search patterns is difficult and potentially incomplete, thus rendering the validation questionable.

For overcoming this problem, it has been proposed to analyse a hardware system by a generalized model thereof, e.g., a netlist model. However, netlist representations still carry details leading to an unnecessary diversity. This diversity has to be matched when defining search patterns to be detected, resulting in a plurality of search patterns to be defined even for detecting a single function and, consequently, in an extensive search, both of which impeding an automatic examination and validation. Moreover, when a specific variation of the diversity is not included in the search pattern definition, this variation and consequently the occurrence of a (malicious) function will not be detected.

F. Demrozi et al., "Exploiting Sub-Graph Isomorphism and Probabilistic Neural Networks for the Detection of Hardware Trojans at RTL", 2017 IEEE International High Level Design Validation and Test Workshop (HLDVT), Santa Cruz, Calif. (2017), pp. 67-73, propose to identify and classify hardware Trojans by means of an algorithm for finding, in a netlist model of the hardware system at register transfer level (RTL), potentially malicious sub-graphs by isomorphism to known hardware Trojans and then using a probabilistic neural network (PNN) for classifying the potentially malicious sub-graphs to eliminate non-malicious ones.

By using a PNN, this approach is non-deterministic and, therefore, not applicable to security-relevant validations. Furthermore, the necessary learning phase of the PNN is based on specific, known hardware Trojans, restricting the application of this method to these learned cases and/or requiring further extensive learning for each further structure to be detected.

BRIEF SUMMARY

It is an object of the present subject matter to provide a deterministic, accurate and efficient method for automatically validating a hardware system by a computer that can be flexibly applied.

This object is achieved by a computer-implemented method for automatically validating a hardware system by a model thereof, wherein the model is a netlist at register transfer level, which netlist is bipartite having cells and links therebetween, the method comprising the following steps carried out by a computer: providing one or more reference structures, which structures are prone to error or manipulation, and determining, in the model, sub-structures, each of which sub-structures comprises a subset of the cells and links of the model and is structurally equivalent to one of said reference structures; extracting, from the model, input cones for each of the determined sub-structures, each input cone comprising control inputs to one of the cells of the sub-structure up to a nearest register output in the model or to a nearest primary input to the model; creating a set of monopartite candidate graphs by mapping the cells and links of each sub-structure and of the respective input cones extracted for the sub-structure to nodes and edges of one of the monopartite candidate graphs of the set, wherein each node has a node type; creating, for each candidate graph, an n-dimensional match vector, each dimension of the match vector comprising a count of occurrences, in the candidate graph, of a different one of a number of n predetermined graphlets, wherein each graphlet has nodes and edges and each node has a node type; clustering, on the basis of similarity of the created match vectors, the candidate graphs in clusters; and selecting, from each of at least some of said clusters, one candidate graph and determining a functional behaviour of the sub-structure the selected candidate graph was mapped from for validating the hardware system.

By creating candidate graphs from reference structures and clustering the candidate graphs on the basis of similarity of the match vectors the present method is very efficient, since the determination of the functional behaviour can be focussed on one candidate graph per clusters rather than determining the functional behaviour of the respective sub-structures of all candidate graphs. This is due to the fact that candidate graphs in the same cluster are of comparable functional behaviour. Some clusters may even be omitted when the functional behaviour of the candidate graphs therein can reliably be derived, e.g., from the cluster's environment and/or separateness from other clusters.

The present method is also very accurate due to the two-stage processing of (i) creating candidate graphs of potentially undesirable functional behaviour by means of reference structures which can be defined rather broadly and (ii) efficiently eliminating, by clustering, e.g., duplicates due to overlapping candidate graphs and/or candidate graphs of desired functional behaviour and thereupon, when no undesirable functional behaviour is determined, validating the hardware structure. Furthermore, the present method is deterministic and therefore applicable in security-relevant cases and can also be flexibly customized to different validation scenarios, e.g., for detecting hardware Trojans, other malicious or simply specific functional behaviours, and adapted or expanded to evolving threats by adding and/or changing either reference structures or graphlets or both.

The graphlets are usually smaller than the candidate graphs, i.e., they comprise fewer nodes and edges, usually they are much smaller. Optionally, each graphlet has two or three nodes. It has been found that graphlets of this size are both characteristic and versatile so that meaningful match vectors are created. Particularly, the nodes and edges of a graphlet which has three nodes form a 2-to-1 coalescence or a 1-to-2 bifurcation. Such coalescing or bifurcating graphlets are particularly characteristic and therefore particularly beneficial for creating meaningful match vectors and distinct clusters whereby the method becomes notably unerring.

In an advantageous embodiment of the method, the graphlets are predetermined by matching each of a set of graphlets with all candidate graphs, and wherein only such graphlets of said set are predetermined for which a match is found in at least one candidate graph. This embodiment facilitates both standardisation and efficiency as the set of graphlets may be large and universal, e.g., an extensive standard set, while only graphlets relevant for the specific validation are considered in the further steps of the method. Thereby, the dimension of the match vectors is reduced to a minimum by relevance.

For further reducing complexity and computational efforts, it is favourable that, in said step of clustering, a principal component analysis is applied to the created match vectors for determining their similarity. Thereby, the dimensionality of the match vectors, which, depending on the number of predetermined graphlets, can be in the range of up to, e.g., a few hundred dimensions, is reduced, in some cases to as little as, e.g., two dimensions. Consequently, the step of clustering is substantially simplified.

While a manifold of algorithms for clustering are known in the art and applicable here, it has been found to be particularly efficient and accurate when said step of clustering the candidate graphs is performed using a density-based clustering algorithm.

It shall be understood that the initial step of determining the sub-structures in the model can be performed in a number of ways, some of which were referred to herein in the outset. The step can, in one embodiment, be performed by searching for, e.g., isomorphic sub-structures directly in the netlist at register transfer level; in other embodiments, the structural equivalence can be determined on a more abstract level of the model. In an optional embodiment, however, said step of determining sub-structures in the model comprises: mapping the cells and links of the model to nodes and edges of a monopartite model graph, wherein each node has a node type, and mapping the cells and links of each of the provided reference structures to nodes and edges of a monopartite reference graph, wherein each node has a node type; finding, in the model graph, sub-graphs, each of which matches one of said reference graphs; and determining, for each of said found sub-graphs, the respective sub-structure in the model by re-mapping the sub-graph back to the model.

By mapping the model to a monopartite model graph, dispensable or non-effective details, e.g., of the links, are eliminated, whereby the matching of the model graph with the reference graphs is simplified and becomes even more efficient because differences which have no effect on the functional behavior are no longer to be considered.

BRIEF DESCRIPTION OF THE DRAWINGS

The present subject matter shall now be explained in more detail below on the basis of exemplary embodiments thereof with reference to the accompanying drawings, in which:

FIGS. 2a to 2d show details of a model of the hardware system validated according to FIG. 1 in a circuit diagram (FIG. 2a), as a bipartite netlist at register transfer level (FIG. 2b), and as a monopartite graph in a linear (FIG. 2c) and a planar (FIG. 2d) diagram, respectively;

FIGS. 3a and 3b show exemplary graphlets to be found in the monopartite graph of FIGS. 2c and 2d, in particular a coalescent 2-to-1 graphlet (FIG. 3a) and a bifurcating 1-to-2 graphlet (FIG. 3b);

DETAILED DESCRIPTION

Figure 1:
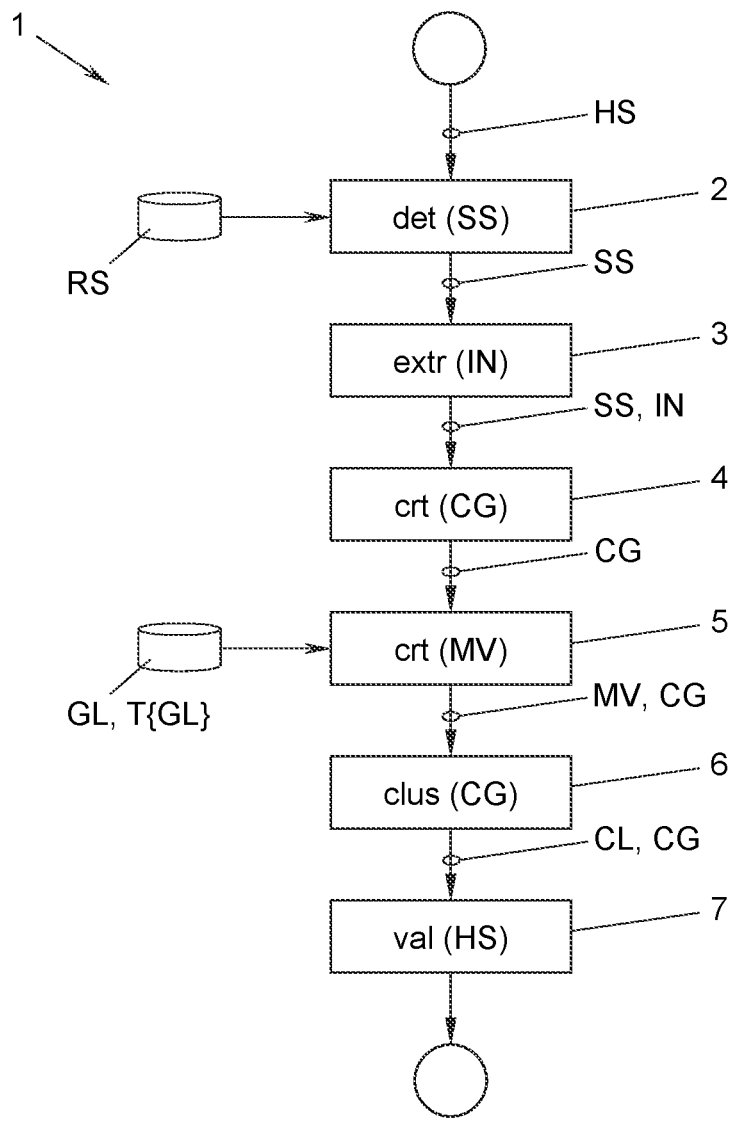
FIG. 1 shows a computer-implemented method for automatically validating a hardware system according to the present subject matter in a flow chart.

The flow chart of FIG. 1 depicts a computer-implemented method 1 for automatically validating (also referred to as "verifying" in the environment of hardware system development and testing) an electrical or electronic circuit (herein: a "hardware system") HS by a computer. A model MO describes the hardware system HS in form of a netlist at register transfer level ("RTL"). The netlist is bipartite, i.e., it has cells $C_1$, $C_2$, . . . , generally C and links $L_1$, $L_2$, . . . , generally $L_k$, (also known as "nets" or "wires") between the cells $C_i$, see FIG. 2a. No cells $C_i$ are immediately connected to other cells $C_i$ without intermediate links $L_k$ and no links $L_k$ are immediately connected to other links $L_k$, see FIG. 2b.

FIG. 2b illustrates the bipartite character on the basis of an exemplary sub-structure SS (FIG. 2a) of the model MO. Therein, the cells $C_1$, $C_2$, $C_3$, $C_4$ of the sub-structure SS are concentrated in a first set $S_1$ on the left, where also further cells $C_i$ of the bipartite model MO would be concentrated (as symbolised by dots in FIG. 2b), whereas the links $L_1$, $L_2$, $L_3$, $L_4$ of the sub-structure SS are concentrated in a second set $S_2$ on the right of FIG. 2b, where also further links $L_k$ of the model MO would be concentrated (as symbolised by dots in FIG. 2b). The interrelation between cells $C_i$ and links $L_k$ is symbolised by intermediate connections CO. The connections CO can be understood, e.g., as input-contacts I or output-contacts O (FIG. 2a) which connect cells $C_i$ and links $L_k$ of the sub-structure SS. For example, cell $C_1$ is connected via its respective output-contact O to link $L_1$ and cell $C_4$ is connected via its respective input-contact I to link $L_1$; no other cells $C_i$ are connected to link $L_1$ as shown by the connections CO in FIG. 2b.

Referring to FIG. 1, in a first step 2 of the computer-implemented method 1 for automatically validating the hardware system HS one or (typically) more reference structures RS are provided in the computer. The provided reference structures RS are relevant for the validation, e.g., because they are prone to error or to possible manipulation by a designer and/or manufacturer of the hardware system HS. Based on the provided reference structures RS, sub-structures SS, each of which is structurally equivalent to one of the reference structures RS, are determined in the model MO. Each of the determined sub-structures SS comprises a subset of the cells $C_i$ and links $L_k$ of the model MO. As will be explicated in greater detail below, the structural equivalence may be determined on the level of the netlist model MO or on a further abstracted level of description of the hardware system HS. Hence, the term "structural equivalence", includes, e.g., isomorphism, on the one hand, but also more general structural comparability, on the other hand.

It shall be noted that, between consecutive steps in the flow chart of FIG. 1, some, usually newly created, information passed from one step to the next one is explicitly noted in the drawing for easier reference. However, further information, e.g., on the hardware system HS and its model MO, is understood to be available throughout all steps of the method 1 without explicit reference in the drawing.

In a second step 3, input cones IN are extracted for each of the determined sub-structures SS from the model MO. Each input cone IN comprises control inputs, i.e., all control inputs in the model MO to one of the cells $C_i$ of the sub-structure SS. Each input cone IN reaches upstream, where necessary more than one upstream-level of a control path of the model MO, to a nearest register output in the model MO or to a nearest primary input, i.e., an input from outside to the model MO. In this way, an input cone IN is extracted for each cell $C_i$ in the sub-structure SS.

In a subsequent step 4, a set of monopartite candidate graphs CG is created from the bipartite sub-structures SS. This is performed by mapping the cells $C_i$ and links $L_k$ of each sub-structure SS and of the respective input cones IN extracted for the sub-structure SS to nodes $N_1$, $N_2$, . . . , generally $N_m$, and edges $E_1$, $E_2$, . . . , generally $E_p$, of one of the candidate graphs CG of the set.

FIGS. 2a to 2d illustrate an example of such a mapping. This example is simplified in that it does not include the input cones IN to the cells $C_i$ of the sub-structure SS, and in that the shown sub-structure SS, for better visibility, has merely four cells $C_1$, $C_2$, $C_3$, $C_4$ and four links $L_1$, $L_2$, $L_3$, $L_4$. Apart from the cells $C_i$ and links $L_k$ of the sub-structure SS, FIG. 2a shows, in dashed lines, further links L' from and to the rest of the model MO (not depicted in FIG. 2a) outside the sub-structure SS.

FIGS. 2c and 2d show two different representations of a monopartite candidate graph CG which was mapped from the sub-structure SS of FIGS. 2a and 2b (in this exemplary illustration: without input cones IN). Therein, the nodes $N_1$, $N_2$, $N_3$, $N_4$ have node types, which are differentiated, in the example of FIGS. 2c and 2d, by lines identifying the nodes $N_1$, $N_2$, $N_3$, $N_4$: In this example, solid lines and dashed lines symbolise a first and a second node type, respectively; in general, the candidate graphs CG may have node types from a set of dozens or even hundreds of different node types as necessary. A node type includes the type of a cell $C_i$ mapped to the node $N_m$, e.g., the cell $C_i$ may be a logical AND, OR etc.; moreover, the node type may be another parameter of the cell $C_i$, e.g., the bit width or the like; furthermore, the node type may comprise parameters of the links $L_k$ between the respective cell $C_i$ and its neighbours, etc., or user defined attributes of the node. A node type may even comprise more than one such parameter, in a combination and/or in two or more dimensions, i.e., the node type is optionally multi-dimensional.

Coming back to the method 1 of FIG. 1, in a step 5 a separate n-dimensional match vector MV (FIG. 4) is created for each candidate graph CG that was created in step 4. For creating the match vectors MV, a number of n graphlets GL, one for each dimension $D_1$, $D_2$, . . . , $D_n$, generally $D_t$, of the match vector MV, was predetermined. Each graphlet GL has nodes $N_{G1}$, $N_{G2}$, . . . , generally $N_{Gq}$, and edges $E_{G1}$, $E_{G2}$, . . . , generally $E_{Gr}$, and each node $N_{Gq}$ has a node type, see FIGS. 3a and 3b. The graphlets GL differ from each other in the node types, in the number of nodes $N_{Gq}$ or edges $E_{Gr}$, and/or in their combination, i.e., in the structure of the graphlets GL. While some graphlets GL may have two nodes $N_{Gq}$, others may have three or more nodes $N_{Gq}$. However, the number of nodes $N_{Gq}$ in the graphlets GL is generally lower or even substantially lower than the number of nodes $N_m$ in typical candidate graphs CG.

FIGS. 3a and 3b show two different examples of graphlets GL, both of which have three nodes $N_{Gq}$. The nodes $N_{Gq}$ and edges $E_{Gr}$ of the graphlet GL in the example of FIG. 3a form a 2-to-1 coalescence, whereas the nodes $N_{Gq}$ and edges $E_{Gr}$ of the graphlet GL in the example of FIG. 3b form a 1-to-2 bifurcation. Similar to the examples of FIGS. 2c and 2d, two different node types of the graphlets GL shown in FIGS. 3a and 3b are symbolised by solid lines and dashed lines, respectively. It shall be understood that, like the candidate graphs CG, also the graphlets GL may have nodes $N_{Gq}$ of more than two different types, e.g., a subset of a set of dozens or even hundreds of node types.

Figure 4:
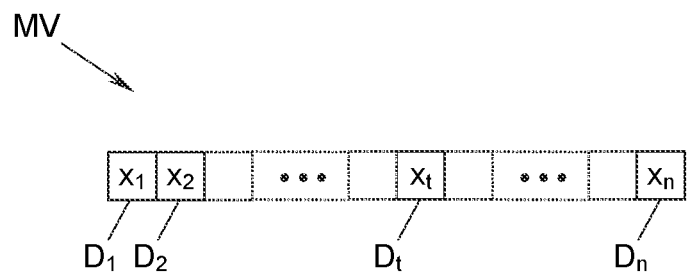
FIG. 4 shows an exemplary match vector for the method of FIG. 1.

As shown in the example of FIG. 4, each match vector MV is created in step 5 of the method 1 by counting the occurrences of each of the predetermined graphlets GL in the candidate graph CG the respective match vector MV is created for, and by filling each count $x_1$, $x_2$, . . . , $x_n$, generally $x_t$, of occurrence in a different one of the dimensions $D_t$ (here: fields) of the match vector MV. Thereby, each dimension $D_t$ of the match vector MV created for a respective candidate graph CG comprises the count $x_t$ of occurrences, in the candidate graph CG, of a different one of the predefined graphlets GL.

In the simplified example of FIGS. 2d, 3a and 3b which comprises one candidate graph CG and two different graphlets GL, the match vector MV is two-dimensional, one dimension $D_t$ for each graphlet GL of FIGS. 3a and 3b, respectively. The graphlet GL of FIG. 3a occurs in the nodes $N_1$-$N_2$-$N_3$ and in the nodes $N_1$-$N_3$-$N_4$ of the candidate graph CG of FIG. 2d; therefore, the first dimension $D_1$ of the match vector MV would comprise the count $x_1=2$. The graphlet GL of FIG. 3b occurs only in the nodes $N_1$-$N_3$-$N_4$ of the candidate graph CG of FIG. 2d and the second dimension $D_2$ of the match vector MV, therefore, would comprise the count $x_2=1$.

It shall be noted that, for typical hardware systems HS, some dozens or even some thousands of candidate graphs CG and match vectors MV may be created by the method 1; moreover, the number n of predetermined graphlets GL and, hence, the n dimensions $D_t$ of each match vector MV may be up to a few dozen or even a few hundred.

In one embodiment, a fixed number n of graphlets GL may have been provided—and thereby be predetermined— for step 5. Alternatively, a set T of graphlets GL may generally be provided for the method 1 and each graphlet GL of the set T is matched with all candidate graphs CG. In this case, only such graphlets GL of the set T are predetermined for step 5, for which graphlets GL a match is found in at least one of the candidate graphs CG. Therein, n is the number of graphlets GL of the set T for which a match was found.

In the next step 6 of FIG. 1, the candidate graphs CG are clustered in clusters CL (FIG. 5) on the basis of similarity of the created match vectors MV.

Figure 5:
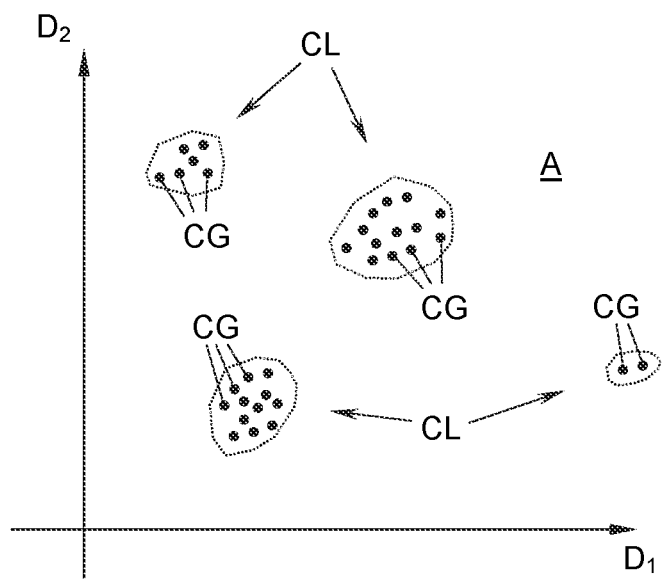
FIG. 5 shows a result of a clustering according to the method of FIG. 1 in a plane diagram.

A multitude of techniques to determine the similarity between vectors is known in the art and may be applied to the match vectors MV. In one embodiment, however, a principal component analysis is applied to the created match vectors MV. By the principal component analysis, the number n of dimensions $D_t$ of the match vectors MV can be significantly reduced in step 6, e.g., to only two dimensions $D_1$, $D_2$ as shown in FIG. 5, even when the original dimensionality was materially higher. Thereby, the determination of the similarity of the match vectors MV is facilitated.

Many different algorithms for clustering are known in the art and can be used. In one embodiment, however, the step 6 of clustering the candidate graphs CG is performed using a density-based clustering algorithm, e.g., using the density-based algorithm known as "OPTICS" in the art.

As shown in the example of FIG. 5, the clustering of step 6 results in the candidate graphs CG being scattered over a (here: two-dimensional; in other cases: multi-dimensional) area A spanned by the dimensions $D_t$ of the match vector MV. Therein, a candidate graph CG which has a match vector MV that is similar to the match vector MV of another candidate graph CG is closer to said other candidate graph CG than to a further candidate graph CG having a dissimilar match vector MV. Thereby, candidate graphs CG lying side by side in the area A are clustered in the clusters CL. Candidate graphs CG of the same cluster CL indicate similar structural composition and, hence, comparable functional behaviour of the sub-structures SS, from which these candidate graphs CG were mapped.

In a subsequent validation step 7, it is therefore sufficient to select only one candidate graph CG of each cluster CL and determine the functional behaviour of the respective sub-structure SS said candidate graph CG was mapped from. When the functional behaviour of this sub-structure SS is invalid, the hardware system HS is not validated. When, on the other hand, the functional behaviour of this sub-structure SS is valid, further candidate graphs CG of the same cluster CL need not be selected. The same is repeated for one candidate graph CG of each of at least some of the remaining clusters CL until either an invalid functional behaviour of a respective sub-structure SS is determined or until the functional behaviour of the respective sub-structure SS of the selected candidate graph CG of each further cluster CL is valid. In the latter case, the hardware system HS is validated.

Some clusters CL may be omitted in step 7, e.g., because they are located in a specific part, for example a remote part of the area A, such that there are good reasons to reliably expect that the behaviours of the respective sub-structures SS of candidate graphs CG in those clusters CL are valid.

It shall be understood that the structural equivalence may be determined in step 2 on a level of description of the hardware system HS which is further abstracted from the netlist model MO.

Figure 6:
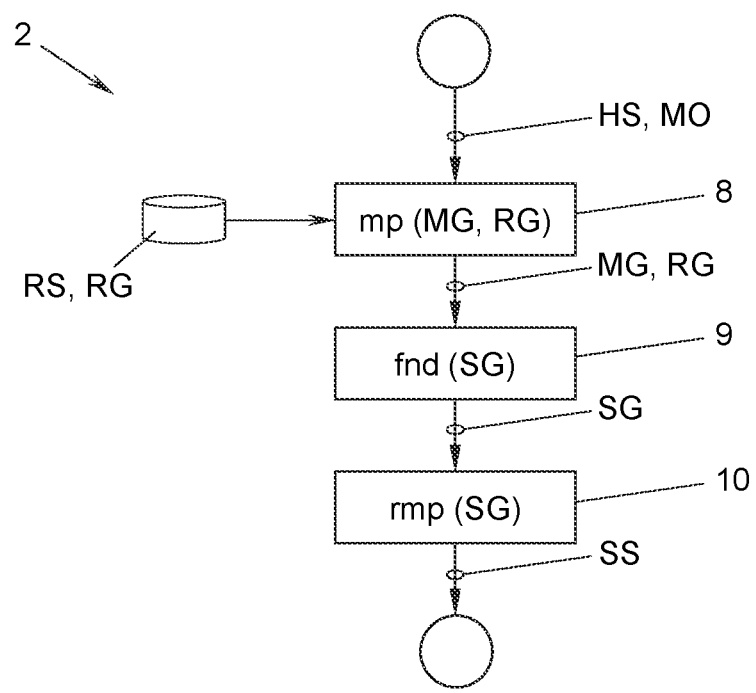
FIG. 6 shows a variation of a part of the method of FIG. 1 in a flow chart.

FIG. 6 depicts one example of such an abstraction of the hardware system's HS description. However, other examples are known to the skilled person. In the example of FIG. 6, said step 2 of determining sub-structures SS in the model MO comprises, in essence, three sub-steps 8 to 10:

The first sub-step 8 relates to mapping the cells $C_i$ and links $L_k$ of the whole model MO to nodes $N_m$ and edges $E_p$ of a monopartite model graph MG, wherein each node $N_m$ has a node type. Such mapping was exemplified with reference to FIGS. 2a to 2d above. Similarly, the cells $C_i$ and links $L_k$ of each of the provided reference structures RS are mapped to nodes $N_m$ and edges $E_p$ of a monopartite reference graph RG, wherein each node $N_m$ has a node type.

In the second sub-step 9, sub-graphs SG are searched and found in the model graph MG, wherein each sub-graph SG matches one of said reference graphs RG. Thereafter, in the sub-step 10, the respective sub-structure SS for each of said found sub-graphs SG is determined in the model MO by re-mapping the sub-graph SG back to the model MO, i.e., by finding the respective sub-structure SS the sub-graph SG was mapped from.

The present subject matter is not restricted to the specific embodiments described in detail herein, but encompasses all variants, modifications and combinations thereof that fall within the framework of the appended claims.

What is claimed is:

1. A computer-implemented method for automatically validating a hardware system by a model thereof, the model being a netlist at register transfer level, which netlist is bipartite having cells and links therebetween, the method comprising the following steps carried out by a computer:
    providing one or more reference structures, which structures are prone to error or manipulation, and determining, in the model, sub-structures, each of which sub-structures comprises a subset of the cells and links of the model and is structurally equivalent to one of said reference structures;
    extracting, from the model, input cones for each of the determined sub-structures, each input cone comprising control inputs to one of the cells of the sub-structure up to at least one of a nearest register output in the model and a nearest primary input to the model;
    creating a set of monopartite candidate graphs by mapping the cells and links of each sub-structure and of the respective input cones extracted for the sub-structure to nodes and edges of one of the monopartite candidate graphs of the set, wherein each node has a node type;
    creating, for each candidate graph, an n-dimensional match vector, each dimension of the match vector comprising a count of occurrences, in the candidate graph, of a different one of a number of n predetermined graphlets, wherein each graphlet has nodes and edges and each node has a node type;
    clustering, on the basis of similarity of the created match vectors, the candidate graphs in clusters; and
    selecting, from each of at least some of said clusters, one candidate graph and determining a functional behaviour of the sub-structure the selected candidate graph was mapped from for validating the hardware system.

2. The method according to claim 1, wherein each graphlet has two or three nodes.

3. The method according to claim 2, wherein the nodes and edges of a graphlet which has three nodes form one of a 2-to-1 coalescence and a 1-to-2 bifurcation.

4. The method according to claim 1, wherein the graphlets are predetermined by matching each of a set of graphlets with all candidate graphs, and wherein only such graphlets of said set are predetermined for which a match is found in at least one candidate graph.

5. The method according to claim 1, wherein, in said step of clustering, a principal component analysis is applied to the created match vectors for determining the similarity of the created match vectors.

6. The method according to claim 1, wherein said step of clustering the candidate graphs is performed using a density-based clustering algorithm.

7. The method according to claim 1, wherein said step of determining sub-structures in the model comprises:
- mapping the cells and links of the model to nodes and edges of a monopartite model graph, wherein each node has a node type, and mapping the cells and links of each of the provided reference structures to nodes and edges, wherein each node has a node type;
- finding, in the model graph, sub-graphs, each of which matches one of said reference graphs; and
- determining, for each of said found sub-graphs, the respective sub-structure in the model by re-mapping the sub-graph back to the model.

\* \* \* \* \*